(12) United States Patent
Sonoda et al.

(10) Patent No.: US 10,490,732 B2
(45) Date of Patent: Nov. 26, 2019

(54) MAGNETIC MEMORY DEVICE WITH SIDEWALL LAYER CONTAINING BORON AND MANUFACTURING METHOD THEREOF

(71) Applicant: Toshiba Memory Corporation, Minato-ku, Tokyo (JP)

(72) Inventors: Yasuyuki Sonoda, Seoul (KR); Daisuke Watanabe, Seoul (KR); Masatoshi Yoshikawa, Seoul (KR); Youngmin Eeh, Seongnam-si (KR); Shuichi Tsubata, Seoul (KR); Toshihiko Nagase, Seoul (KR); Yutaka Hashimoto, Seoul (KR); Kazuya Sawada, Seoul (KR); Kazuhiro Tomioka, Seoul (KR); Kenichi Yoshino, Seoul (KR); Tadaaki Oikawa, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 71 days.

(21) Appl. No.: 15/268,527

(22) Filed: Sep. 16, 2016

(65) Prior Publication Data

US 2017/0263858 A1    Sep. 14, 2017

Related U.S. Application Data

(60) Provisional application No. 62/307,055, filed on Mar. 11, 2016.

(51) Int. Cl.
*H01L 45/00*    (2006.01)
*H01L 43/08*    (2006.01)
(Continued)

(52) U.S. Cl.
CPC ............ *H01L 43/08* (2013.01); *G11C 11/161* (2013.01); *H01L 27/224* (2013.01); *H01L 43/12* (2013.01); *H01L 45/124* (2013.01); *H01L 27/228* (2013.01)

(58) Field of Classification Search
CPC ........ H01L 27/222; H01L 43/08; H01L 43/10
See application file for complete search history.

(56) References Cited

U.S. PATENT DOCUMENTS

| | | | |
|---|---|---|---|
| 5,731,626 A | 3/1998 | Eaglesham et al. | |
| 5,738,938 A | 4/1998 | Kawano et al. | |

(Continued)

FOREIGN PATENT DOCUMENTS

| | | | |
|---|---|---|---|
| JP | 2004172645 A | 6/2004 | |
| JP | 2004179187 A | 6/2004 | |

(Continued)

OTHER PUBLICATIONS

U.S. Appl. No. 62/394,708; First Named Inventor: Youngmin Eeh; Title: "Semiconductor Device Having Rare Earth Oxide Layer and Method of Manufacturing the Same"; filed Sep. 14, 2016.

(Continued)

*Primary Examiner* — Cheung Lee
(74) *Attorney, Agent, or Firm* — Holtz, Holtz & Volek PC

(57) ABSTRACT

According to one embodiment, a magnetic memory device includes a stacked structure including a first magnetic layer, a second magnetic layer and a nonmagnetic layer between the first magnetic layer and the second magnetic layer, and a sidewall insulating layer provided on a side surface of the stacked structure and containing boron (B).

5 Claims, 16 Drawing Sheets

(51) Int. Cl.
*G11C 11/16* (2006.01)
*H01L 43/12* (2006.01)
*H01L 27/22* (2006.01)

(56) References Cited

U.S. PATENT DOCUMENTS

| | | |
|---|---|---|
| 6,522,573 B2 | 2/2003 | Saito et al. |
| 7,345,855 B2 | 3/2008 | Parkin |
| 8,098,514 B2 | 1/2012 | Nagase et al. |
| 8,299,552 B2 | 10/2012 | Nagase et al. |
| 9,263,668 B2 | 2/2016 | Choi et al. |
| 2002/0037595 A1 | 3/2002 | Hosotani |
| 2003/0174446 A1* | 9/2003 | Hasegawa ............... B82Y 10/00 360/319 |
| 2005/0023579 A1* | 2/2005 | Yamazaki ............ C23C 14/0057 257/288 |
| 2005/0226036 A1 | 10/2005 | Aratani et al. |
| 2006/0240656 A1 | 10/2006 | Ann |
| 2012/0135543 A1* | 5/2012 | Shin ...................... H01L 27/228 438/3 |
| 2015/0069554 A1 | 3/2015 | Nakayama et al. |
| 2016/0163971 A1* | 6/2016 | Jeong ..................... H01L 43/12 438/3 |
| 2016/0268496 A1 | 9/2016 | Yamane et al. |

FOREIGN PATENT DOCUMENTS

| | | |
|---|---|---|
| JP | 2004214228 A | 7/2004 |
| JP | 2010093157 A | 4/2010 |
| JP | 2010205931 A | 9/2010 |
| JP | 2010251523 A | 11/2010 |
| JP | 2014135449 A | 7/2014 |
| TW | 200541055 A | 12/2005 |
| TW | 201532040 A | 8/2015 |
| WO | 2015136723 A1 | 9/2015 |

OTHER PUBLICATIONS

Kolmogorov, et al., "Theoretical study of metal borides stability", Physical Review B 74, 224507 (2006); The American Physical Society, Dec. 26, 2006; pp. 224507-1-224507-14.

Bae, et al., "Compositional change of MgO barrier and interface in Co Fe B/Mg O/Co Fe B tunnel junction after annealing", Journal of Applied Physics 99, 2006, pp. 08T316-1 to 08T316-3.

Burton, et al., "Atomic and electronic structure of the Co Fe B/Mg O interface from first principles", Applied Physics Letters 89, 2006, pp. 142507-1 to 142507-3.

* cited by examiner

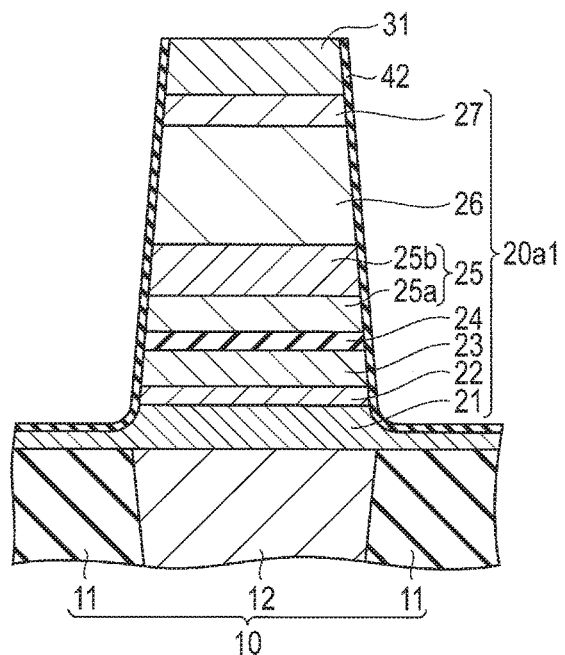
F I G. 3
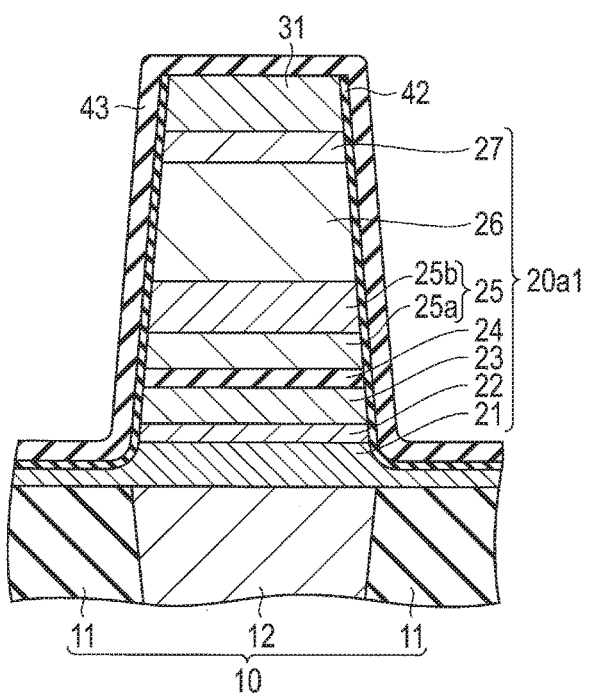
F I G. 4

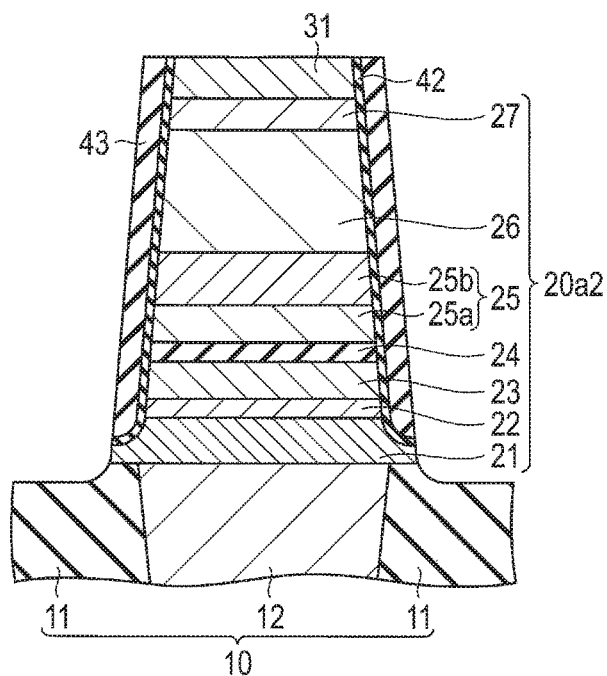
F I G. 5
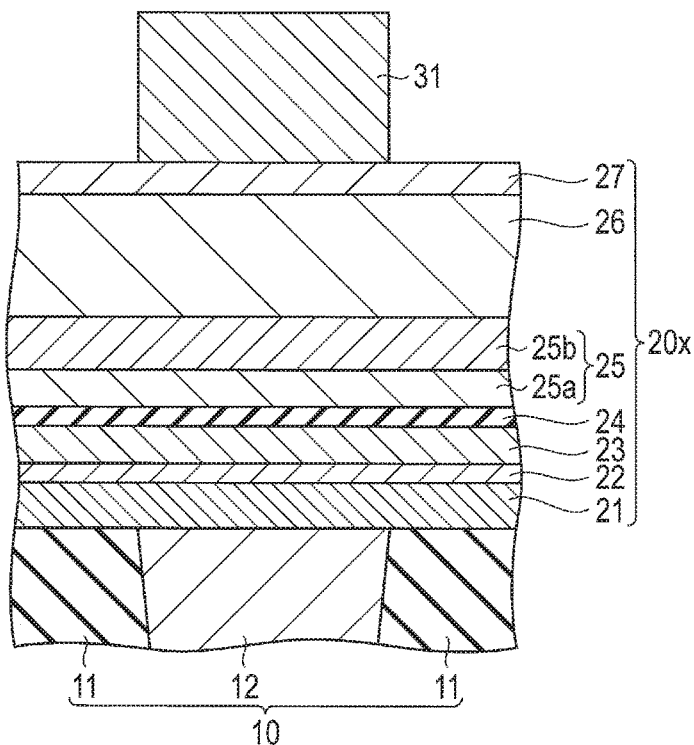
F I G. 6

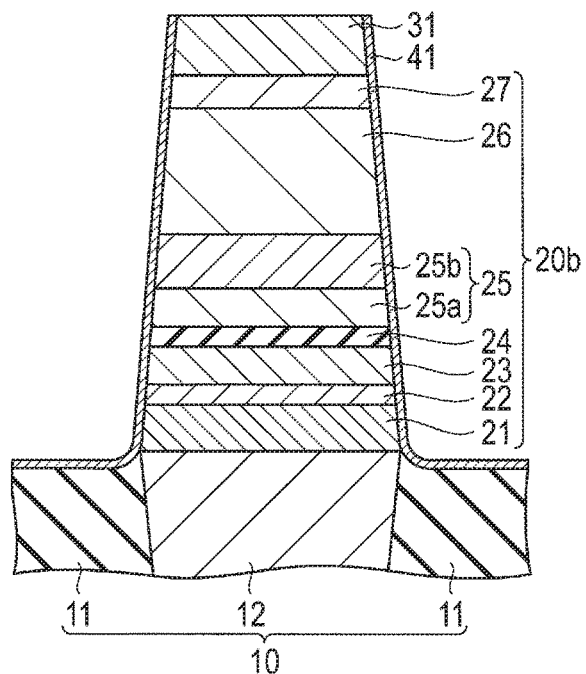
F I G. 7
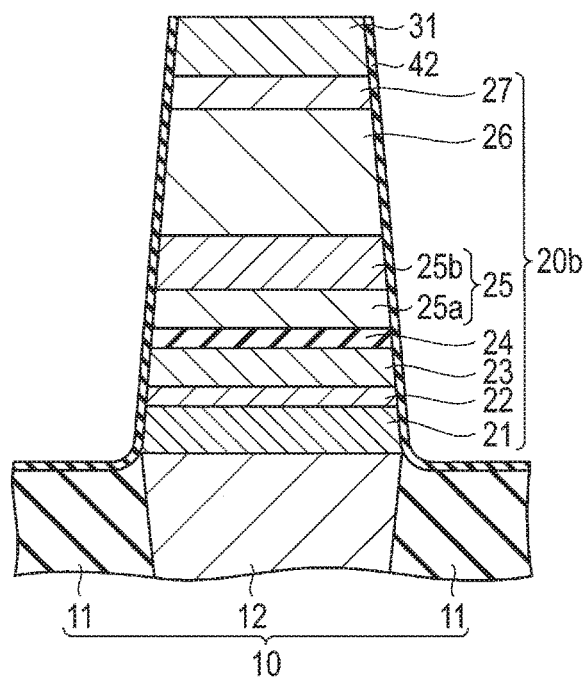
F I G. 8

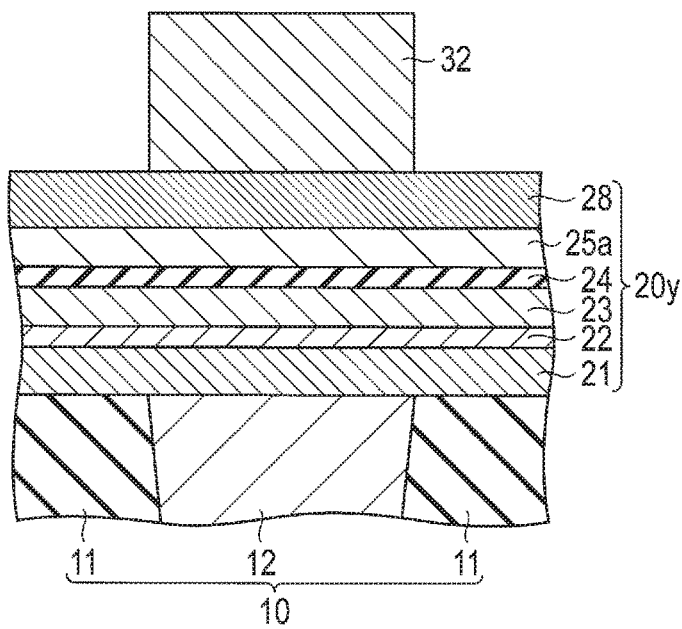
F I G. 9
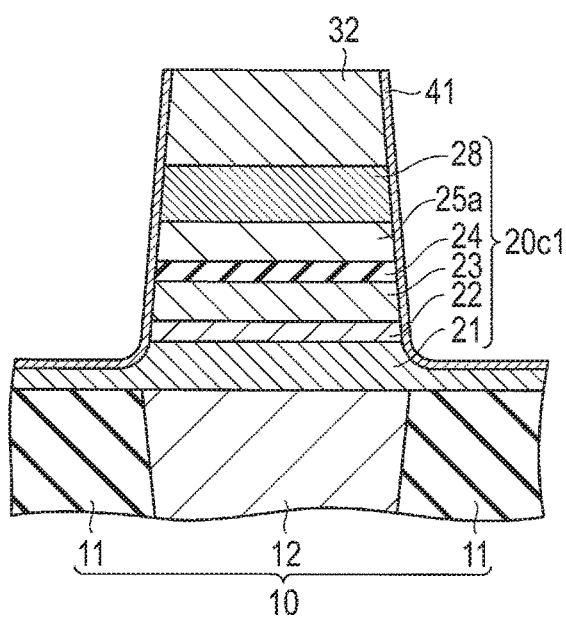
F I G. 10

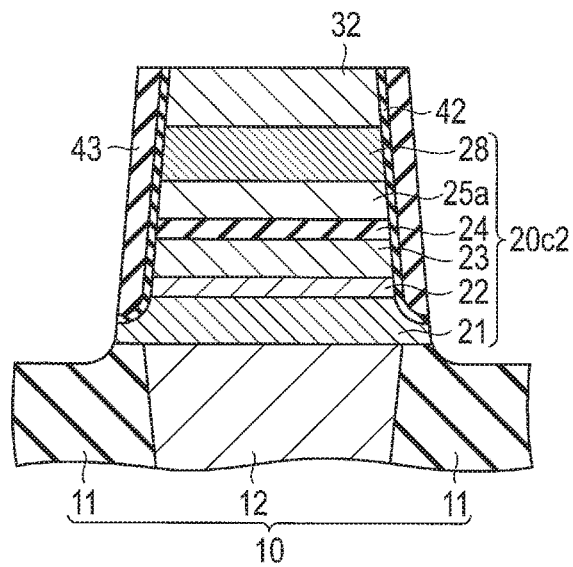
F I G. 13
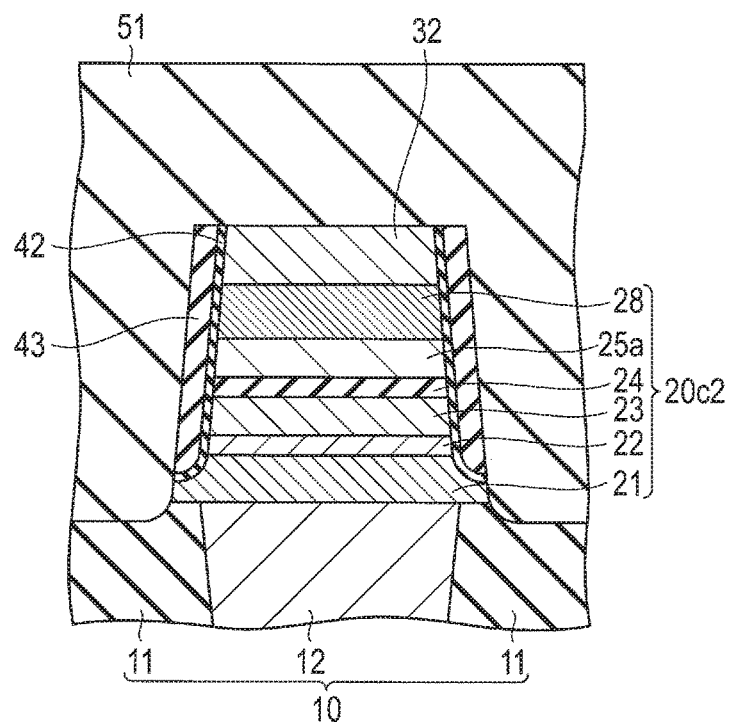
F I G. 14

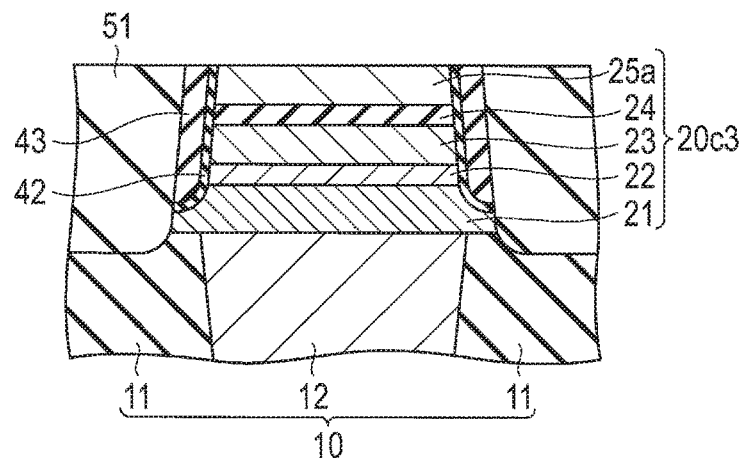
F I G. 15
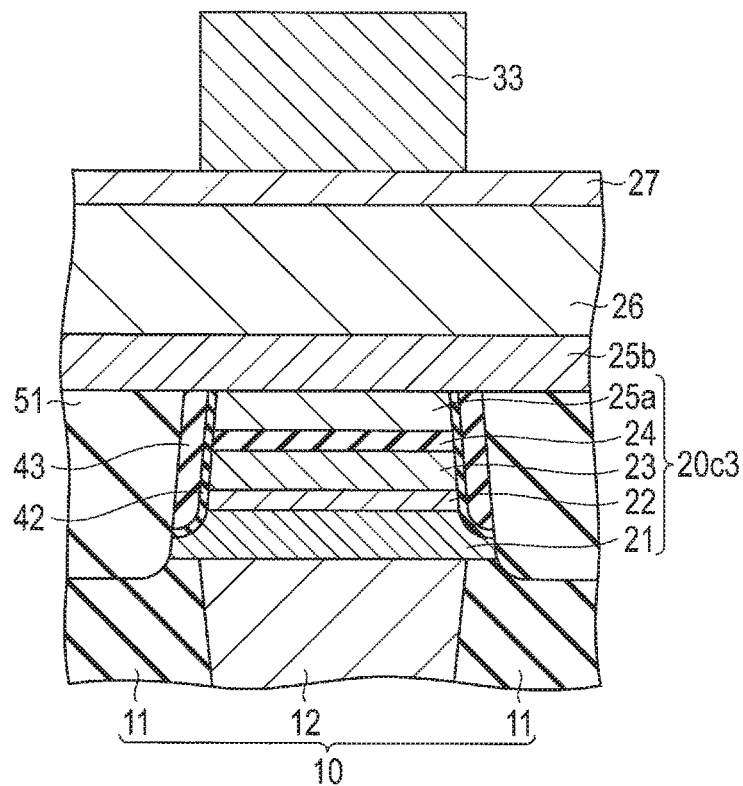
F I G. 16

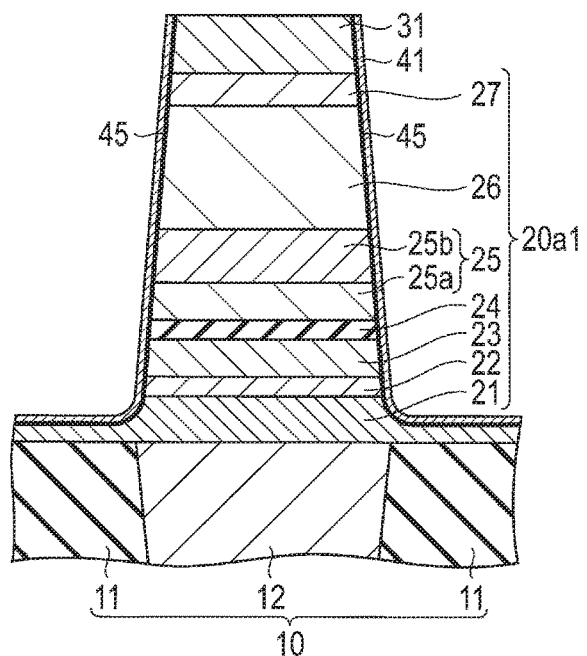
F I G. 19
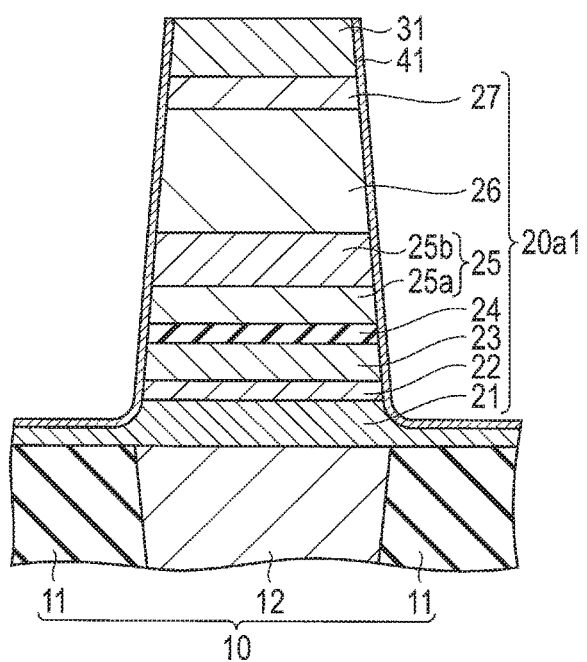
F I G. 20

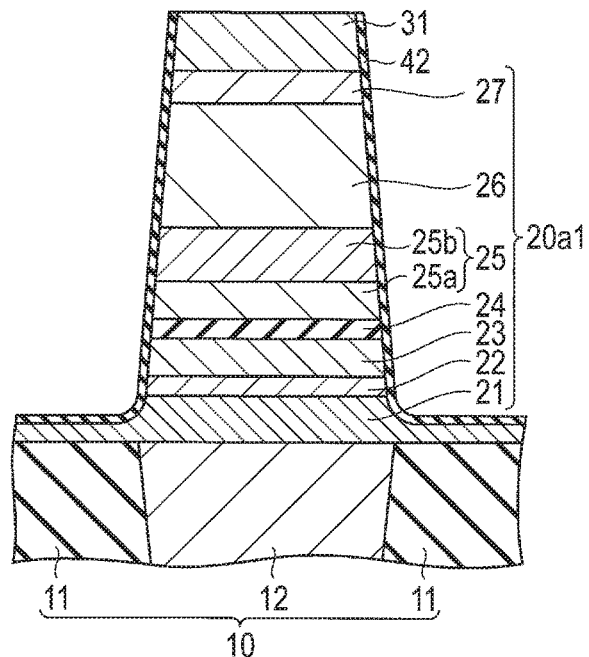
F I G. 21
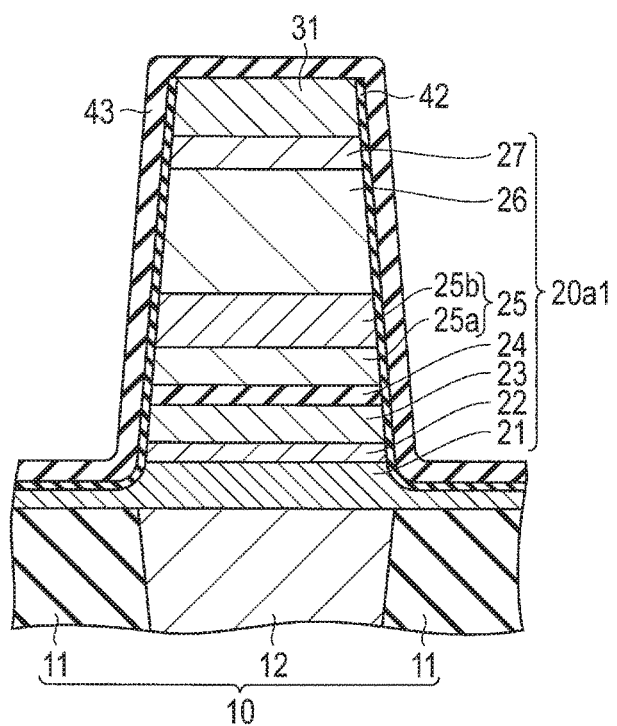
F I G. 22

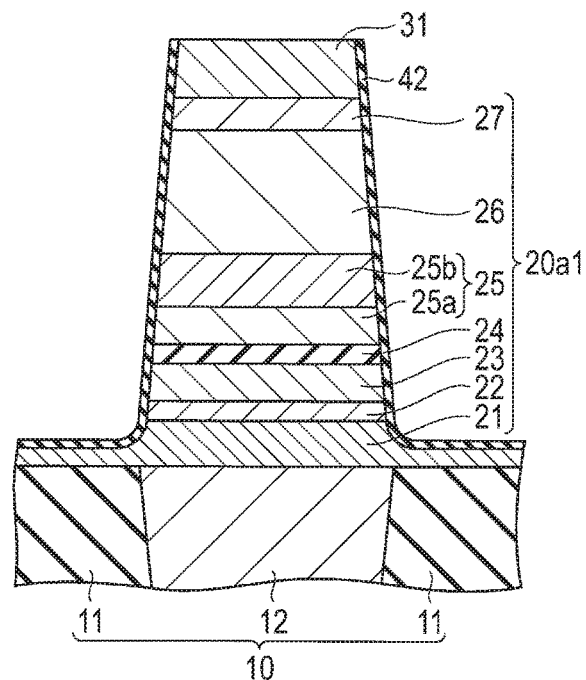
F I G. 26
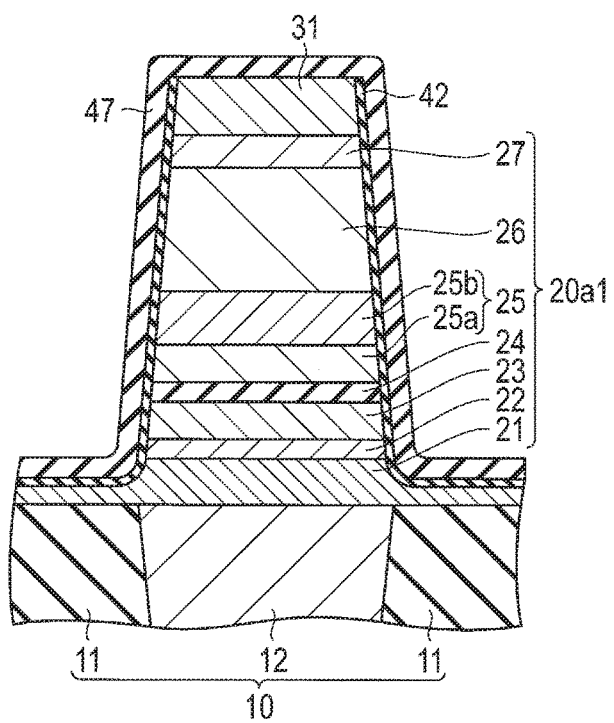
F I G. 27

MAGNETIC MEMORY DEVICE WITH SIDEWALL LAYER CONTAINING BORON AND MANUFACTURING METHOD THEREOF

CROSS-REFERENCE TO RELATED APPLICATIONS

This application claims the benefit of U.S. Provisional Application No. 62/307,055, filed Mar. 11, 2016, the entire contents of which are incorporated herein by reference.

FIELD

Embodiments described herein relate generally to a magnetic memory device and a method of manufacturing a magnetic memory device.

BACKGROUND

A magnetic memory device (semiconductor integrated circuit device) in which a magnetoresistive element and a transistor are integrated on a semiconductor substrate is suggested.

The storage layer and the reference layer of the above magnetoresistive element contain boron (B). Boron which is present at the interface between the storage layer and a tunnel barrier layer and the interface between the reference layer and the tunnel barrier layer may detrimentally affect the properties of the magnetoresistive element. In consideration of the above situation, a magnetic memory device which can prevent a detrimental effect to be caused by boron and a method of manufacturing such a magnetic memory device are required.

In the etching process for forming the pattern of the stacked structure of the magnetoresistive element, a damage layer may be formed on a side surface of the stacked structure and negatively affect the properties of the magnetoresistive element. Thus, a method of manufacturing a magnetic memory device which can prevent a detrimental effect to be caused by a damage layer is required.

BRIEF DESCRIPTION OF THE DRAWINGS

FIG. 3 is a cross-sectional view schematically showing a part of the method of manufacturing the magnetic memory device according to the first embodiment.

FIG. 4 is a cross-sectional view schematically showing a part of the method of manufacturing the magnetic memory device according to the first embodiment.

FIG. 5 is a cross-sectional view schematically showing a part of the method of manufacturing the magnetic memory device according to the first embodiment.

FIG. 6 is a cross-sectional view schematically showing a part of a method of manufacturing a magnetic memory device according to a second embodiment.

FIG. 7 is a cross-sectional view schematically showing a part of the method of manufacturing the magnetic memory device according to the second embodiment.

FIG. 8 is a cross-sectional view schematically showing a part of the method of manufacturing the magnetic memory device according to the second embodiment.

FIG. 9 is a cross-sectional view schematically showing a part of a method of manufacturing a magnetic memory device according to a third embodiment.

FIG. 10 is a cross-sectional view schematically showing a part of the method of manufacturing the magnetic memory device according to the third embodiment.

FIG. 13 is a cross-sectional view schematically showing a part of the method of manufacturing the magnetic memory device according to the third embodiment.

FIG. 14 is a cross-sectional view schematically showing a part of the method of manufacturing the magnetic memory device according to the third embodiment.

FIG. 15 is a cross-sectional view schematically showing a part of the method of manufacturing the magnetic memory device according to the third embodiment.

FIG. 16 is a cross-sectional view schematically showing a part of the method of manufacturing the magnetic memory device according to the third embodiment.

FIG. 19 is a cross-sectional view schematically showing a part of the method of manufacturing the magnetic memory device according to the fourth embodiment.

FIG. 20 is a cross-sectional view schematically showing a part of the method of manufacturing the magnetic memory device according to the fourth embodiment.

FIG. 21 is a cross-sectional view schematically showing a part of the method of manufacturing the magnetic memory device according to the fourth embodiment.

FIG. 22 is a cross-sectional view schematically showing a part of the method of manufacturing the magnetic memory device according to the fourth embodiment.

FIG. 26 is a cross-sectional view schematically showing a part of the method of manufacturing the magnetic memory device according to the fifth embodiment.

FIG. 27 is a cross-sectional view schematically showing a part of the method of manufacturing the magnetic memory device according to the fifth embodiment.

DETAILED DESCRIPTION

In general, according to one embodiment, a magnetic memory device includes: a stacked structure including a first magnetic layer, a second magnetic layer and a nonmagnetic layer between the first magnetic layer and the second magnetic layer; and a sidewall insulating layer provided on a side surface of the stacked structure and containing boron (B).

Embodiments will be described hereinafter with reference to the accompanying drawings.

Embodiment 1

A first embodiment is explained.

FIG. 1 to FIG. 5 are cross-sectional views schematically showing a method of manufacturing a magnetic memory device (semiconductor integrated circuit device) according to the first embodiment.

Figure 1:
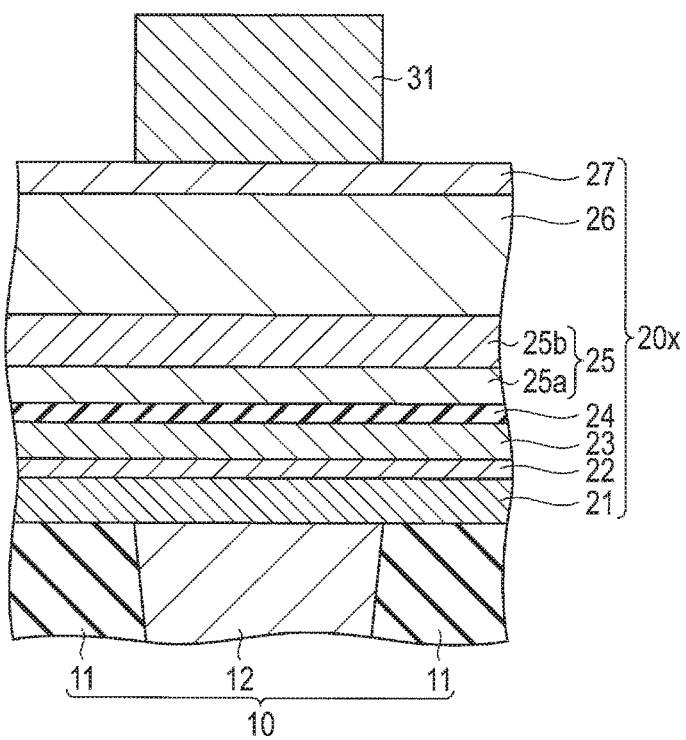
FIG. 1 is a cross-sectional view schematically showing a part of a method of manufacturing a magnetic memory device according to a first embodiment.

As shown in FIG. 1, a bottom area 10 including, for example, an interlayer insulating film 11 and a bottom electrode 12 is formed on a semiconductor substrate (not shown). The bottom area 10 further includes a MOS transistor (not shown), etc.

A stacked film 20x including a first magnetic layer, a second magnetic layer and a nonmagnetic layer between the first and second magnetic layers is formed on the bottom area 10. Specifically, a buffer layer 21, an underlayer 22, a storage layer 23, a tunnel barrier layer 24, a reference layer 25, a shift canceling layer 26 and a cap layer 27 are formed as the stacked film 20x. The reference layer 25 includes a lower portion 25a and an upper portion 25b. One of the storage layer 23 and the lower portion 25a of the reference layer 25 corresponds to the first magnetic layer. The other one of the storage layer 23 and the lower portion 25a of the reference layer 25 corresponds to the second magnetic layer. The tunnel barrier layer 24 corresponds to the nonmagnetic layer.

The storage layer 23 (one of the first and second magnetic layers) includes an amorphous structure and contains boron (B). The storage layer 23 contains at least one of cobalt (Co) and iron (Fe). Specifically, the storage layer 23 is formed of amorphous CoFeB. Amorphous FeB may be used for the storage layer 23.

The tunnel barrier layer (nonmagnetic layer) 24 contains magnesium (Mg) and oxygen (O). Specifically, the tunnel barrier layer 24 is formed of MgO.

The lower portion 25a (the other one of the first and second magnetic layers) of the reference layer 25 includes an amorphous structure and contains boron (B). The lower portion 25a of the reference layer 25 contains at least one of cobalt (Co) and iron (Fe). Specifically, the lower portion 25a of the reference layer 25 is formed of amorphous CoFeB. Amorphous FeB may be used for the lower portion 25a of the reference layer 25. The upper portion 25b of the reference layer 25 is formed of CoPt, CoNi or CoPd. An intermediate layer formed by an element selected from Ta, Zr, W, Hf, Mo, Nb, Ti, V and Cr may be provided between the lower portion 25a and the upper portion 25b.

In the present embodiment, both the first magnetic layer and the second magnetic layer include an amorphous structure and contain boron (B). However, at least one of the first and second magnetic layers is required to include an amorphous structure and contain boron (B).

The shift canceling layer 26 is formed of CoPt, CoNi or CoPd. An intermediate layer formed of Ru may be provided between the reference layer 25 and the shift canceling layer 26.

After forming the stacked film 20x, a hard mask 31 is formed on the stacked film 20x, using a conductive material.

Figure 2:
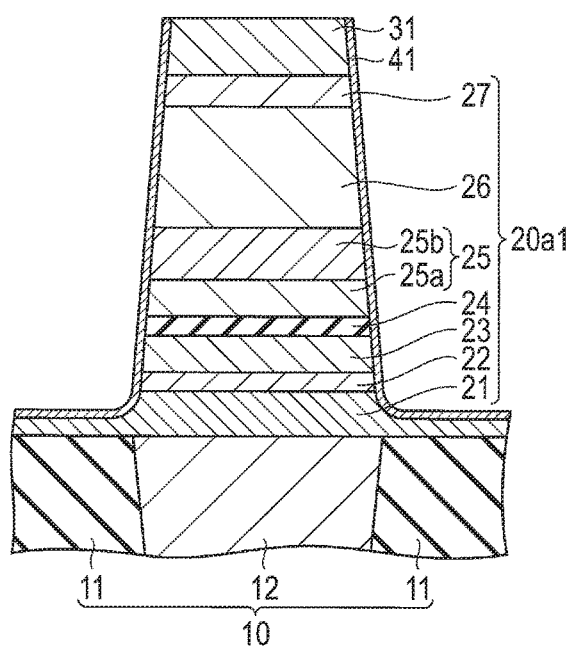
FIG. 2 is a cross-sectional view schematically showing a part of the method of manufacturing the magnetic memory device according to the first embodiment.

Subsequently, as shown in FIG. 2, a stacked structure 20a1 is formed by patterning the stacked film 20x. Specifically, stacked structure 20a1 is formed by etching the stacked film 20x using the hard mask 31 as a mask. Ion beam etching (IBE) or reactive ion etching (RIE) is used to etch the stacked film 20x. By this etching process, a re-deposition layer 41 is formed on a side surface of stacked structure 20a1.

Subsequently, thermal treatment (thermal treatment 1A) is applied to stacked structure 20a1. Thus, the amorphous structures included in the first and second magnetic layers are crystallized. In other words, stacked structure 20a1 is thermally processed to crystallize the amorphous structures included in the storage layer 23 and the lower portion 25a of the reference layer 25. By thermally processing stacked structure 20a1, the boron (B) contained in the first and second magnetic layers is diffused to the side surface of stacked structure 20a1. Thus, the boron (B) contained in the storage layer 23 and the lower portion 25a of the reference layer 25 is diffused to the side surface of stacked structure 20a1. The boron which has reached the side surface of stacked structure 20a1 is further diffused to the re-deposition layer 41. The thermal treatment (thermal treatment 1A) in this process may be omitted.

Subsequently, as shown in FIG. 3, oxidation treatment is applied to the side surface of stacked structure 20a1. By this oxidation treatment, the re-deposition layer 41 is oxidized. Thus, an oxide layer 42 is formed on the side surface of stacked structure 20a1 as a sidewall insulating layer. The oxidation treatment may be performed by exposing stacked structure 20a1 to the air. Plasma oxidation or radical oxidation may be used as the oxidation treatment. At the time of oxidation treatment, heat may or may not be applied.

Subsequently, thermal treatment (thermal treatment 1B) is applied to stacked structure 20a1. When thermal treatment 1A is omitted, the amorphous structures included in the storage layer 23 and the lower portion 25a of the reference layer 25 are crystallized by thermal treatment 1B in this process. By the thermal treatment in this process, the boron (B) contained in the storage layer 23 and the lower portion 25a of the reference layer 25 is diffused to the side surface of stacked structure 20a1. The boron which has reached the side surface of stacked structure 20a1 is diffused to the oxide layer 42 formed on the side surface of stacked structure 20a1. When thermal treatment 1A is performed, the crystallization and the diffusion of boron described above are further promoted by the thermal treatment (thermal treatment 1B) in this process. The thermal treatment (thermal treatment 1B) in this process may be omitted.

Subsequently, as shown in FIG. 4, silicon nitride (SiN) is deposited on the oxide layer 42 formed on the side surface of stacked structure 20a1. Thus, a silicon nitride (SiN) layer 43 is formed on the side surface of stacked structure 20a1 as a sidewall insulating layer. The nitride layer 43 is formed by, for example, chemical vapor deposition (CVD).

Thermal treatment (thermal treatment 1C) is applied to stacked structure 20a1 by applying heat when the silicon nitride layer 43 is deposited. When thermal treatments 1A and 1B are omitted, the amorphous structures included in the storage layer 23 and the lower portion 25a of the reference layer 25 are crystallized by thermal treatment 1C in this process. By the thermal treatment in this process, the boron (B) contained in the storage layer 23 and the lower portion 25a of the reference layer 25 is diffused to the side surface of stacked structure 20a1. The boron which has reached the side surface of stacked structure 20a1 is diffused to the oxide layer 42 formed on the side surface of stacked structure 20a1. When at least one of thermal treatments 1A and 1B is performed, the crystallization and the diffusion of boron described above are further promoted by the thermal treatment (thermal treatment 1C) in this process. Heat need not be applied when the silicon nitride layer 43 is deposited. Thus, the thermal treatment (thermal treatment 1C) in this process may be omitted.

After forming the nitride layer 43, thermal treatment (thermal treatment 1D) is applied to stacked structure 20a1. When thermal treatments 1A, 1B and 1C are omitted, the amorphous structures included in the storage layer 23 and the lower portion 25a of the reference layer 25 are crystallized by thermal treatment 1D in this process. By the thermal treatment in this process, the boron (B) contained in the storage layer 23 and the lower portion 25a of the reference layer 25 is diffused to the side surface of stacked structure 20a1. The boron which has reached the side surface of stacked structure 20a1 is diffused to the oxide layer 42 and the nitride layer 43 formed on the side surface of stacked structure 20a1. When at least one of thermal treatments 1A, 1B and 1C is performed, the crystallization and the diffusion of boron described above are further promoted by the thermal treatment (thermal treatment 1D) in this process. The thermal treatment (thermal treatment 1D) in this process may be omitted.

Subsequently, as shown in FIG. 5, an etching process including IBE is performed. As a result, the nitride layer 43, the oxide layer 42, the buffer layer 21 and the interlayer insulating film 11 are etched, and thus, a stacked structure 20a2 is obtained. In this manner, stacked structure 20a2 is completely separated from an adjacent stacked structure.

Subsequently, thermal treatment (thermal treatment 1E) is applied to stacked structure 20a2. When thermal treatments 1A, 1B, 1C and 1D are omitted, the amorphous structures included in the storage layer 23 and the lower portion 25a of the reference layer 25 are crystallized by thermal treatment 1E in this process. By the thermal treatment in this process, the boron (B) contained in the storage layer 23 and the lower portion 25a of the reference layer 25 is diffused to the side surface of stacked structure 20a2. The boron which has reached the side surface of stacked structure 20a2 is diffused to the oxide layer 42 and the nitride layer 43 formed on the side surface of stacked structure 20a2. When at least one of thermal treatments 1A, 1B, 1C and 1D is performed, the crystallization and the diffusion of boron described above are further promoted by the thermal treatment (thermal treatment 1E) in this process. The thermal treatment (thermal treatment 1E) in this process may be omitted.

Although the subsequent processes are not shown in the drawings, for example, an insulating film which covers stacked structure 20a2, a top electrode which is connected to stacked structure 20a2, and a bit line are formed.

In the above manner, a magnetic memory device is obtained such that the magnetic memory device comprises stacked structure 20a2 and the sidewall insulating layers (the oxide layer 42 and the nitride layer 43) which are provided on the side surface of stacked structure 20a2 and contain boron (B). Stacked structure 20a2 includes the crystallized storage layer 23 having a variable magnetization direction, the crystallized reference layer 25 having a fixed magnetization direction, the tunnel barrier layer 24 between the storage layer 23 and the reference layer 25, and the shift canceling layer 26 on the reference layer 25. The shift canceling layer 26 is crystallized and has a fixed magnetization direction. The magnetization direction of the shift canceling layer 26 is opposite to that of the reference layer 25.

Stacked structure 20a2 of the magnetic memory device described above functions as a magnetoresistive element, that is, a magnetic tunnel junction (MTJ) element. In this magnetoresistive element, the resistance of stacked structure 20a2 (the magnetoresistive element) when the magnetization direction of the storage layer 23 is parallel to that of the reference layer 25 is less than that when the magnetization direction of the storage layer 23 is antiparallel to that of the reference layer 25. When the magnetization direction of the storage layer 23 is parallel to that of the reference layer 25, the resistance of the magnetoresistive element (MTJ element) is low. When the magnetization direction of the storage layer 23 is antiparallel to that of the reference layer 25, the resistance of the magnetoresistive element (MTJ element) is high. Thus, a binary value (0 or 1) can be stored in the magnetoresistive element based on the resistive state (a low or high resistive state). The resistive state (a low or high resistive state) of the magnetoresistive element can be set based on the direction of write current flowing in the magnetoresistive element.

According to the above manufacturing method, the storage layer 23 and the lower portion 25a of the reference layer 25 in the stacked film 20x are in an amorphous state. The stacked film 20x is patterned to form stacked structure 20a1. Subsequently, thermal treatment is applied. By this treatment, the storage layer 23 and the lower portion 25a of the reference layer 25 are crystallized. As a result, it is possible to prevent a detrimental effect to be caused by boron (B) contained in the storage layer 23 and the lower portion 25a of the reference layer 25. This specification further explains this prevention.

If thermal treatment for crystallization is applied (in other words, if a thermal budget for crystallization is applied) before patterning the stacked film 20x, the boron contained in the storage layer 23 and the lower portion 25a of the reference layer 25 may be accumulated at the interfaces of the tunnel barrier layer 24 (specifically, the interface between the storage layer 23 and the tunnel barrier layer 24, and the interface between the lower portion 25a of the reference layer 25 and the tunnel barrier layer 24). The boron contained in the storage layer 23 and the lower portion 25a of the reference layer 25 is diffused by thermal treatment for crystallization. However, since the storage layer 23 and the lower portion 25a of the reference layer 25 are continuous in a horizontal direction, there is no portion in which boron is accumulated in a horizontal direction. In a perpendicular direction, the interfaces of the tunnel barrier layer 24 are present. Thus, the boron which has reached the interfaces of the tunnel barrier layer 24 by thermal treatment for crystallization is accumulated at the interfaces of the tunnel barrier layer 24. If boron is accumulated at the interfaces of the tunnel barrier layer 24, the properties of the magnetoresistive element are negatively affected. In particular, the MR of the magnetoresistive element is reduced.

In the present embodiment, the stacked film 20x is patterned to form stacked structure 20a1. Subsequently, thermal treatment for crystallization is performed (in other words, a thermal budget for crystallization is added). When thermal treatment for crystallization is applied, the storage layer 23 and the lower portion 25a of the reference layer 25 in stacked structure 20a1 are not continuous in a horizontal direction. Thus, the boron which has been diffused in a horizontal direction is diffused to the outside of stacked structure 20a1. Specifically, the boron which has been diffused in a horizontal direction is diffused to the sidewall layers (specifically, the re-deposition layer 41, the oxide layer 42 and the nitride layer 43) formed on the side surface of stacked structure 20a1. In this way, boron is accumulated in the sidewall layers. In this manner, it is possible to prevent the accumulation of boron at the interfaces of the tunnel barrier layer 24. The reduction in the properties of the magnetoresistive element (in particular, the reduction in the MR) can be prevented.

In the above embodiment, the stacked film 20x is patterned to form stacked structure 20a1. Subsequently, thermal treatment for crystallization is performed a plurality of times (thermal treatment 1A to thermal treatment 1E). However, the above effect can be obtained if thermal treatment for crystallization is performed at least once after forming stacked structure 20a1. It should be noted that, if thermal treatment for crystallization is performed a plurality of times after forming stacked structure 20a1, the above effect can be further enhanced.

Embodiment 2

A second embodiment is explained. The basic matters are the same as those of the first embodiment. Thus, the explanation of the matters described in the first embodiment is omitted.

FIG. 6 to FIG. 8 are cross-sectional views schematically showing a method of manufacturing a magnetic memory device (semiconductor integrated circuit device) according to the second embodiment.

In the above first embodiment, a part of the buffer layer 21 is not patterned in the process of FIG. 2. However, in the present embodiment, the buffer layer 21 is completely patterned in the process of FIG. 7. In the above first embodiment, the nitride layer 43 is formed on the oxide layer 42 in the process of FIG. 4. However, in the present embodiment, the nitride layer 43 is not formed.

As shown in FIG. 6, in a manner similar to that of the first embodiment, a stacked film 20x including a buffer layer 21, an underlayer 22, a storage layer 23, a tunnel barrier layer 24, a reference layer 25 (including a lower portion 25a and an upper portion 25b), a shift canceling layer 26 and a cap layer 27 is formed on a bottom area 10. Further, in a manner similar to that of the first embodiment, a hard mask 31 is formed on the stacked film 20x, using a conductive material.

Subsequently, as shown in FIG. 7, the stacked film 20x is patterned to form a stacked structure 20b. Specifically, the stacked film 20x is etched by IBE or RIE, using the hard mask 31 as a mask. In this manner, the stacked structure 20b is formed. By this etching process, a re-deposition layer 41 is formed on a side surface of the stacked structure 20b.

Subsequently, thermal treatment (thermal treatment 2A) is applied to the stacked structure 20b to crystallize the amorphous structures included in the storage layer 23 and the lower portion 25a of the reference layer 25. By thermally processing the stacked structure 20b, the boron (B) contained in the storage layer 23 and the lower portion 25a of the reference layer 25 is diffused to the side surface of the stacked structure 20b. The boron which has reached the side surface of the stacked structure 20b is further diffused to the re-deposition layer 41. The thermal treatment (thermal treatment 2A) in this process may be omitted.

Subsequently, as shown in FIG. 8, oxidation treatment is applied to the side surface of the stacked structure 20b. By this oxidation treatment, the re-deposition layer 41 is oxidized. Thus, an oxide layer 42 is formed on the side surface of the stacked structure 20b as a sidewall insulating layer. The method of oxidation treatment is the same as that of the first embodiment.

Subsequently, thermal treatment (thermal treatment 2B) is applied to the stacked structure 20b. When thermal treatment 2A is omitted, the amorphous structures included in the storage layer 23 and the lower portion 25a of the reference layer 25 are crystallized by thermal treatment 2B in this process. By the thermal treatment in this process, the boron (B) contained in the storage layer 23 and the lower portion 25a of the reference layer 25 is diffused to the side surface of the stacked structure 20b. The boron which has reached the side surface of the stacked structure 20b is diffused to the oxide layer 42 formed on the side surface of the stacked structure 20b. When thermal treatment 2A is performed, the crystallization and the diffusion of boron described above are further promoted by the thermal treatment (thermal treatment 2B) in this process. The thermal treatment (thermal treatment 2B) in this process may be omitted.

Although the subsequent processes are not shown in the drawings, for example, an insulating film which covers the stacked structure 20b, a top electrode which is connected to the stacked structure 20b, and a bit line are formed.

In the above manner, the magnetic memory device is obtained so as to comprise the stacked structure 20b and the sidewall insulating layer (the oxide layer 42) which is provided on the side surface of the stacked structure 20b and contains boron (B). The stacked structure 20b includes the crystallized storage layer 23 having a variable magnetization direction, the crystallized reference layer 25 having a fixed magnetization direction, the tunnel barrier layer 24 between the storage layer 23 and the reference layer 25, and the shift canceling layer 26 on the reference layer 25.

In the present embodiment, in a manner similar to that of the first embodiment, thermal treatment for crystallization is applied after patterning the stacked film 20x and forming the stacked structure 20b. Thus, the boron which has been diffused in a horizontal direction is diffused to the outside of the stacked structure 20b. Specifically, the boron which has been diffused in a horizontal direction is diffused to the sidewall layers (specifically, the re-deposition layer 41 and the oxide layer 42) formed on the side surface of the stacked structure 20b. In this way, boron is accumulated in the sidewall layers. In this manner, it is possible to prevent the accumulation of boron at the interfaces of the tunnel barrier layer 24. The reduction in the properties of the magnetoresistive element (MTJ element) (in particular, the reduction in the MR) can be prevented.

In the present embodiment, in a manner similar to that of the first embodiment, the above effect can be obtained if thermal treatment for crystallization is performed at least once after patterning the stacked film 20x and forming the stacked structure 20b.

Embodiment 3

A third embodiment is explained. The basic matters are the same as those of the first embodiment. Thus, the explanation of the matters described in the first embodiment is omitted.

FIG. 9 to FIG. 17 are cross-sectional views schematically showing a method of manufacturing a magnetic memory device (semiconductor integrated circuit device) according to the third embodiment.

As shown in FIG. 9, in a manner similar to that of the first embodiment, a stacked film 20y including a buffer layer 21, an underlayer 22, a storage layer 23, a tunnel barrier layer 24, a lower portion 25a of a reference layer 25 and a cap layer 28 is formed on a bottom area 10. In the present embodiment, the stacked film 20y does not include an upper portion 25b of the reference layer 25 and a shift canceling layer 26. Further, a hard mask 32 is formed on the stacked film 20y, using a conductive material.

Subsequently, as shown in FIG. 10, a stacked structure 20c1 is formed by patterning the stacked film 20y. Specifically, the stacked film 20y is etched by IBE or RIE, using the hard mask 32 as a mask. In this manner, stacked structure 20c1 is formed. By this etching process, a re-deposition layer 41 is formed on a side surface of stacked structure 20c1.

Subsequently, thermal treatment (thermal treatment 3A) is applied to stacked structure 20c1 to crystallize the amorphous structures included in the storage layer 23 and the lower portion 25a of the reference layer 25. By thermally processing stacked structure 20c1, the boron (B) contained in the storage layer 23 and the lower portion 25a of the reference layer 25 is diffused to the side surface of stacked structure 20c1. The boron which has reached the side surface of stacked structure 20c1 is further diffused to the re-deposition layer 41. The thermal treatment (thermal treatment 3A) in this process may be omitted.

Figure 11:
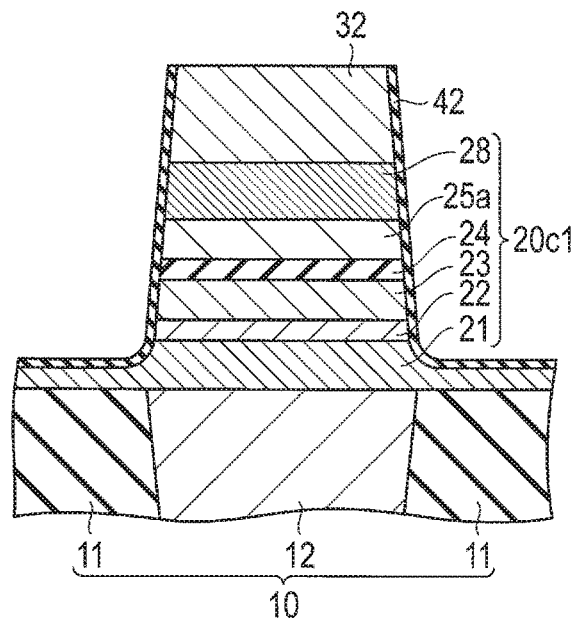
FIG. 11 is a cross-sectional view schematically showing a part of the method of manufacturing the magnetic memory device according to the third embodiment.

Subsequently, as shown in FIG. 11, oxidation treatment is applied to the side surface of stacked structure 20c1. By this oxidation treatment, the re-deposition layer 41 is oxidized. Thus, an oxide layer 42 is formed on the side surface of stacked structure 20c1 as a sidewall insulating layer. The method of oxidation treatment is the same as that of the first embodiment.

Subsequently, thermal treatment (thermal treatment 3B) is applied to stacked structure 20c1. When thermal treatment 3A is omitted, the amorphous structures included in the storage layer 23 and the lower portion 25a of the reference layer 25 are crystallized by thermal treatment 3B in this process. By the thermal treatment in this process, the boron (B) contained in the storage layer 23 and the lower portion 25a of the reference layer 25 is diffused to the side surface of stacked structure 20c1. The boron which has reached the side surface of stacked structure 20c1 is diffused to the oxide layer 42 formed on the side surface of stacked structure 20c1. When thermal treatment 3A is performed, the crystallization and the diffusion of boron described above are further promoted by the thermal treatment (thermal treatment 3B) in this process. The thermal treatment (thermal treatment 3B) in this process may be omitted.

Figure 12:
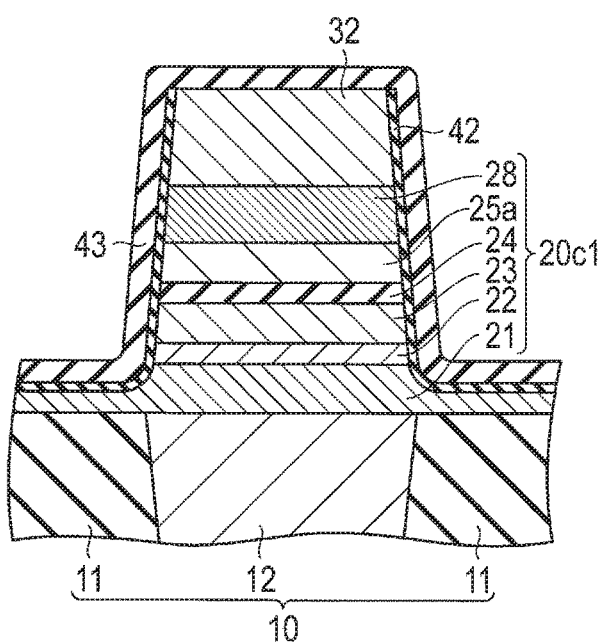
FIG. 12 is a cross-sectional view schematically showing a part of the method of manufacturing the magnetic memory device according to the third embodiment.

Subsequently, as shown in FIG. 12, silicon nitride (SiN) is deposited on the oxide layer 42 formed on the side surface of stacked structure 20c1. Thus, a silicon nitride (SiN) layer 43 is formed on the side surface of stacked structure 20c1 as a sidewall insulating layer. The nitride layer 43 is formed by, for example, chemical vapor deposition (CVD).

Thermal treatment (thermal treatment 3C) is applied to stacked structure 20c1 by applying heat when the silicon nitride layer 43 is deposited. When thermal treatments 3A and 3B are omitted, the amorphous structures included in the storage layer 23 and the lower portion 25a of the reference layer 25 are crystallized by thermal treatment 3C in this process. By the thermal treatment in this process, the boron (B) contained in the storage layer 23 and the lower portion 25a of the reference layer 25 is diffused to the side surface of stacked structure 20c1. The boron which has reached the side surface of stacked structure 20c1 is diffused to the oxide layer 42 formed on the side surface of stacked structure 20c1. When at least one of thermal treatments 3A and 3B is performed, the crystallization and the diffusion of boron described above are further promoted by the thermal treatment (thermal treatment 3C) in this process. Heat need not be applied when the silicon nitride layer 43 is deposited. Thus, the thermal treatment (thermal treatment 3C) in this process may be omitted.

After forming the nitride layer 43, thermal treatment (thermal treatment 3D) is applied to stacked structure 20c1. When thermal treatments 3A, 3B and 3C are omitted, the amorphous structures included in the storage layer 23 and the lower portion 25a of the reference layer 25 are crystallized by thermal treatment 3D in this process. By the thermal treatment in this process, the boron (B) contained in the storage layer 23 and the lower portion 25a of the reference layer 25 is diffused to the side surface of stacked structure 20c1. The boron which has reached the side surface of stacked structure 20c1 is diffused to the oxide layer 42 and the nitride layer 43 formed on the side surface of stacked structure 20c1. When at least one of thermal treatments 3A, 3B and 3C is performed, the crystallization and the diffusion of boron described above are further promoted by the thermal treatment (thermal treatment 3D) in this process. The thermal treatment (thermal treatment 3D) in this process may be omitted.

Subsequently, as shown in FIG. 13, an etching process including IBE or RIE is performed. As a result, the nitride layer 43, the oxide layer 42, the buffer layer 21 and an interlayer insulating film 11 are etched, and thus, a stacked structure 20c2 is obtained. In this manner, stacked structure 20c2 is completely separated from an adjacent stacked structure.

Subsequently, thermal treatment (thermal treatment 3E) is applied to stacked structure 20c2. When thermal treatments 3A, 3B, 3C and 3D are omitted, the amorphous structures included in the storage layer 23 and the lower portion 25a of the reference layer 25 are crystallized by thermal treatment 3E in this process. By the thermal treatment in this process, the boron (B) contained in the storage layer 23 and the lower portion 25a of the reference layer 25 is diffused to the side surface of stacked structure 20c2. The boron which has reached the side surface of stacked structure 20c2 is diffused to the oxide layer 42 and the nitride layer 43 formed on the side surface of stacked structure 20c2. When at least one of thermal treatments 3A, 3B, 3C and 3D is performed, the crystallization and the diffusion of boron described above are further promoted by the thermal treatment (thermal treatment 3E) in this process. The thermal treatment (thermal treatment 3E) in this process may be omitted.

Subsequently, as shown in FIG. 14, an interlayer insulating film 51 is formed on the entire surface so as to cover stacked structure 20c2.

Subsequently, as shown in FIG. 15, planarization is performed by chemical mechanical polishing (CMP). Planarization may be performed by an etch-back process such as IBE or RIE. In this manner, the interlayer insulating film 51 and the hard mask 32 are removed. At this time, the surface of the lower portion 25a of the reference layer 25 is covered by the cap layer 28. Thus, the surface is protected from CMP. Subsequently, for example, the cap layer 28 is removed by an etch-back process to expose the surface of the lower portion 25a of the reference layer 25. In this manner, a stacked structure 20c3 including the buffer layer 21, the underlayer 22, the storage layer 23, the tunnel barrier layer 24 and the lower portion 25a of the reference layer 25 is obtained.

Subsequently, as shown in FIG. 16, an upper portion 25b of the reference layer 25 is formed on the entire surface including the upper surface of stacked structure 20c3. Subsequently, a shift canceling layer 26 and a cap layer 27 are formed on the upper portion 25b of the reference layer 25. Further, a hard mask 33 is formed on the cap layer 27, using a conductive material.

Figure 17:
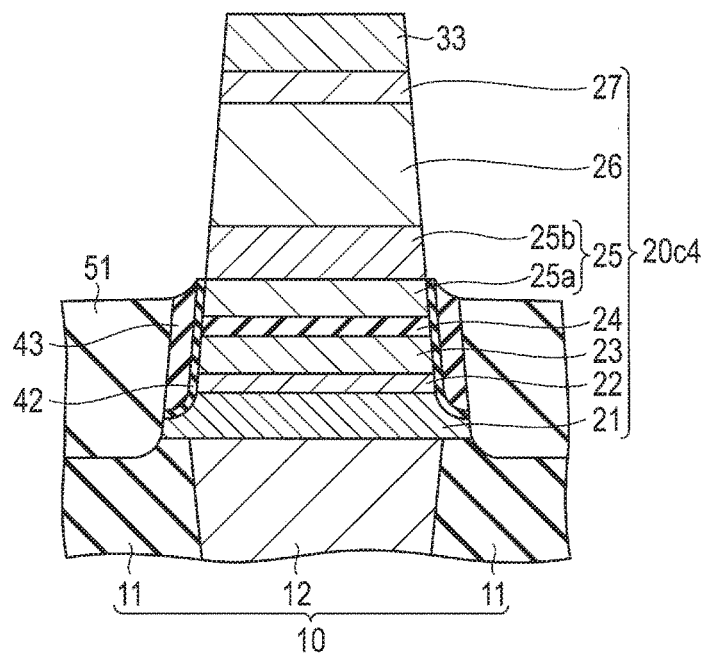
FIG. 17 is a cross-sectional view schematically showing a part of the method of manufacturing the magnetic memory device according to the third embodiment.

Subsequently, as shown in FIG. 17, the upper portion 25b of the reference layer 25, the shift canceling layer 26 and the cap layer 27 are etched by IBE or RIE, using the hard mask 33 as a mask. In this manner, a stacked structure 20c4 is formed.

Although the subsequent processes are not shown in the drawings, for example, an insulating film which covers stacked structure 20c4, a top electrode which is connected to stacked structure 20c4, and a bit line are formed.

In the above manner, the magnetic memory device is obtained so as to comprise stacked structure 20c4 and the sidewall insulating layers (the oxide layer 42 and the nitride layer 43) which are provided on the side surface of the lower part of stacked structure 20c4 and contain boron (B). Stacked structure 20c4 includes the crystallized storage layer 23 having a variable magnetization direction, the crystallized reference layer 25 having a fixed magnetization direction, the tunnel barrier layer 24 between the storage layer 23 and the reference layer 25, and the shift canceling layer 26 on the reference layer 25.

In the present embodiment, in a manner similar to that of the first embodiment, thermal treatment for crystallization is applied after patterning the stacked film 20y and forming stacked structure 20c1. Thus, the boron which has been diffused in a horizontal direction is diffused to the outside of stacked structure 20c1. Specifically, the boron which has been diffused in a horizontal direction is diffused to the sidewall layers (specifically, the re-deposition layer 41, the oxide layer 42 and the nitride layer 43) formed on the side surface of stacked structure 20c1. In this way, boron is accumulated in the sidewall layers. In this manner, it is possible to prevent the accumulation of boron at the interfaces of the tunnel barrier layer 24. The reduction in the properties of the magnetoresistive element (MTJ element) (in particular, the reduction in the MR) can be prevented.

In the present embodiment, in a manner similar to that of the first embodiment, the above effect can be obtained if thermal treatment for crystallization is performed at least once after patterning the stacked film 20y and forming stacked structure 20c1.

Embodiment 4

A fourth embodiment is explained. The basic matters are the same as those of the first embodiment. Thus, the explanation of the matters described in the first embodiment is omitted.

FIG. 18 to FIG. 23 are cross-sectional views schematically showing a method of manufacturing a magnetic memory device (semiconductor integrated circuit device) according to the fourth embodiment.

Figure 18:
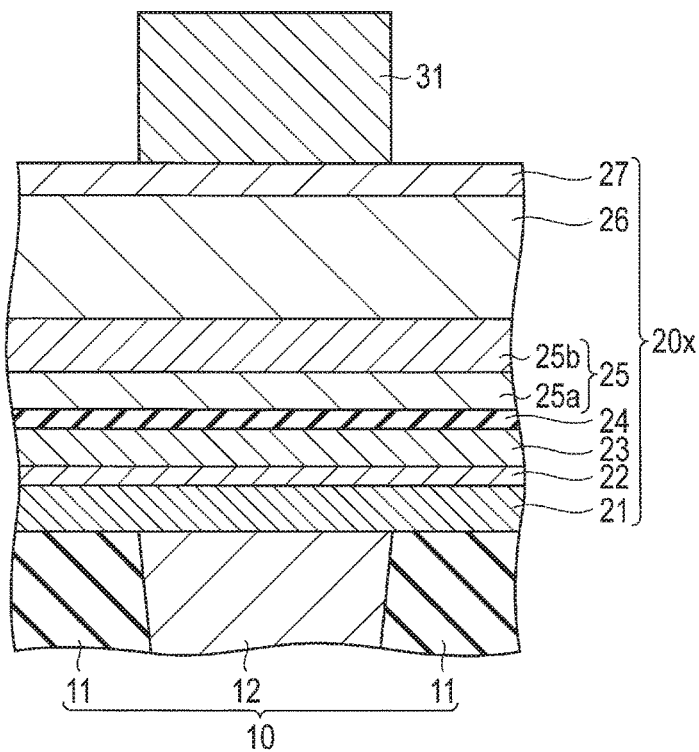
FIG. 18 is a cross-sectional view schematically showing a part of a method of manufacturing a magnetic memory device according to a fourth embodiment.

As shown in FIG. 18, in a manner similar to that of the first embodiment, a stacked film 20x including a buffer layer 21, an underlayer 22, a storage layer 23, a tunnel barrier layer 24, a reference layer 25 (including a lower portion 25a and an upper portion 25b), a shift canceling layer 26 and a cap layer 27 is formed on a bottom area 10. Further, in a manner similar to that of the first embodiment, a hard mask 31 is formed on the stacked film 20x, using a conductive material. In the present embodiment, thermal treatment may be applied to the stacked film 20x to crystallize the storage layer 23 and the reference layer 25.

Subsequently, as shown in FIG. 19, a stacked structure 20a1 is formed by patterning the stacked film 20x. Specifically, the stacked film 20x is etched by IBE or RIE, using the hard mask 31 as a mask. In this manner, stacked structure 20a1 is formed. By this etching process, a re-deposition layer 41 is formed on a side surface of stacked structure 20a1. By this etching process, the surface of stacked structure 20a1 is damaged. Thus, a damage layer 45 is formed on the side surface of stacked structure 20a1. The damage layer 45 is formed between stacked structure 20a1 and the re-deposition layer 41.

Subsequently, as shown in FIG. 20, thermal treatment is applied to stacked structure 20a1 in nonoxidizing atmosphere. Specifically, thermal treatment is applied in vacuum atmosphere in the chamber in which the etching process to form stacked structure 20a1 has been performed. In other words, thermal treatment is applied by an in-situ process in the chamber in which the etching process to form stacked structure 20a1 has been performed. For example, a stage comprising a heater is provided in an etching chamber (IBE chamber). On the stage, an etching process (IBE process) and thermal treatment are performed continuously. The damage layer 45 formed on the side surface of stacked structure 20a1 is recovered by the thermal treatment in nonoxidizing atmosphere. Thermal treatment in nonoxidizing atmosphere may be performed in a heating chamber different from the etching chamber. In this case, when a wafer is moved from the etching chamber to the heating chamber, the wafer should not be exposed to the air. The damage layer 45 is recovered in the following manner by the thermal treatment in nonoxidizing atmosphere.

When the storage layer 23 and the reference layer 25 are crystallized in advance, the damage layer 45 is recrystallized by thermal treatment in nonoxidizing atmosphere based on the crystallinity of the storage layer 23 and the reference layer 25. Thus, the damage layer 45 is recovered. When the storage layer 23 and the reference layer 25 is not crystallized in advance, the damage layer 45 is crystallized as well as the storage layer 23 and the reference layer 25 by thermal treatment in nonoxidizing atmosphere. Thus, the damage layer 45 is recovered.

In the above thermal treatment in nonoxidizing atmosphere, at least the damage layer formed on the side surfaces of the storage layer 23, the tunnel barrier layer 24 and the lower portion 25a of the reference layer 25 has to be recovered.

Subsequently, as shown in FIG. 21, oxidation treatment is applied to the side surface of stacked structure 20a1 after the damage layer 45 is recovered by the thermal treatment in nonoxidizing atmosphere. By this oxidation treatment, the re-deposition layer 41 is oxidized. Thus, an oxide layer 42 is formed on the side surface of stacked structure 20a1 as a sidewall insulating layer. The method of oxidation treatment is the same as that of the first embodiment.

Subsequently, as shown in FIG. 22, silicon nitride (SiN) is deposited on the oxide layer 42 formed on the side surface of stacked structure 20a1. Thus, a silicon nitride (SiN) layer 43 is formed on the side surface of stacked structure 20a1 as a sidewall insulating layer. The nitride layer 43 is formed by, for example, CVD.

Figure 23:
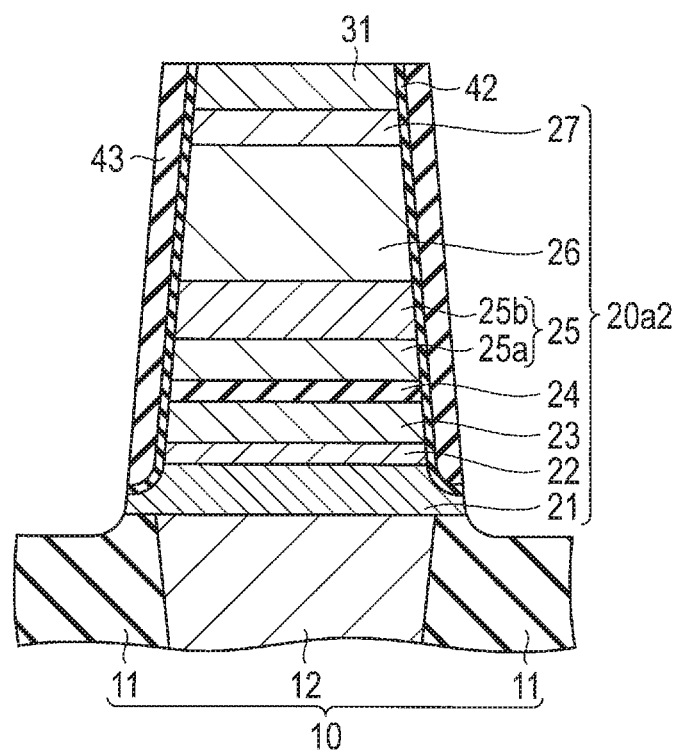
FIG. 23 is a cross-sectional view schematically showing a part of the method of manufacturing the magnetic memory device according to the fourth embodiment.

Subsequently, as shown in FIG. 23, an etching process including IBE is performed. As a result, the nitride layer 43, the oxide layer 42, the buffer layer 21 and an interlayer insulating film 11 are etched, and thus, a stacked structure 20a2 is obtained. In this manner, stacked structure 20a2 is completely separated from an adjacent stacked structure.

Although the subsequent processes are not shown in the drawings, for example, an insulating film which covers stacked structure 20a2, a top electrode which is connected to stacked structure 20a2, and a bit line are formed.

As described above, in the present embodiment, thermal treatment is applied to stacked structure 20a1 in nonoxidizing atmosphere. Thus, the damage layer 45 formed on the side surface of stacked structure 20a1 can be recovered. In particular, thermal treatment is applied in the chamber in which the etching process to form stacked structure 20a1 has been performed. Thus, the thermal treatment can be performed without exposing stacked structure 20a1 to oxidizing atmosphere. In this manner, the damage layer 45 can be certainly recovered. As a result, it is possible to prevent the reduction in the properties of the magnetoresistive element (MTJ element) to be caused by the damage layer 45 (in particular, the reduction in the MR).

Embodiment 5

A fifth embodiment is explained. The basic matters are the same as those of the first embodiment. Thus, the explanation of the matters described in the first embodiment is omitted.

FIG. 24 to FIG. 28 are cross-sectional views schematically showing a method of manufacturing a magnetic memory device (semiconductor integrated circuit device) according to the fifth embodiment.

Figure 24:
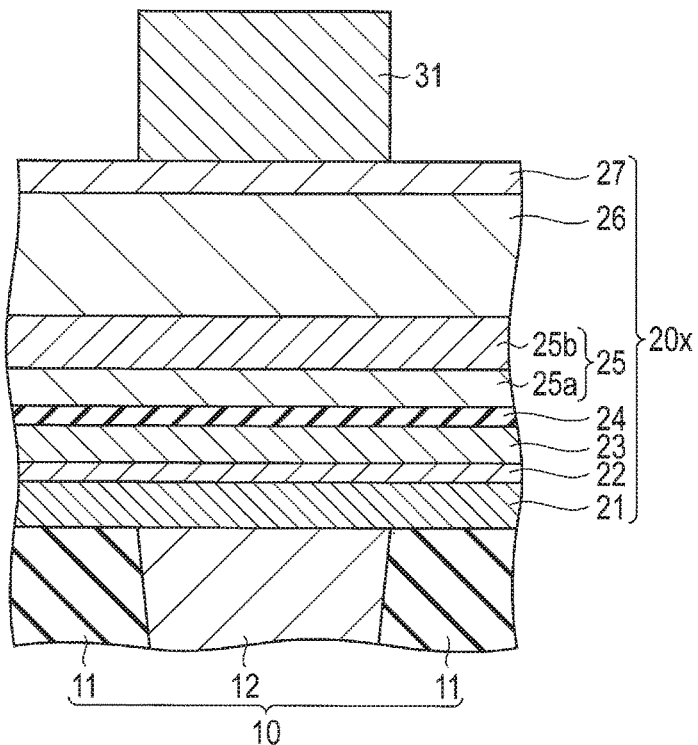
FIG. 24 is a cross-sectional view schematically showing a part of the method of manufacturing the magnetic memory device according to the fifth embodiment.

As shown in FIG. 24, in a manner similar to that of the first embodiment, a stacked film 20x including a buffer layer 21, an underlayer 22, a storage layer 23, a tunnel barrier layer 24, a reference layer 25 (including a lower portion 25a and an upper portion 25b), a shift canceling layer 26 and a cap layer 27 is formed on a bottom area 10. Further, in a manner similar to that of the first embodiment, a hard mask 31 is formed on the stacked film 20x, using a conductive material.

Figure 25:
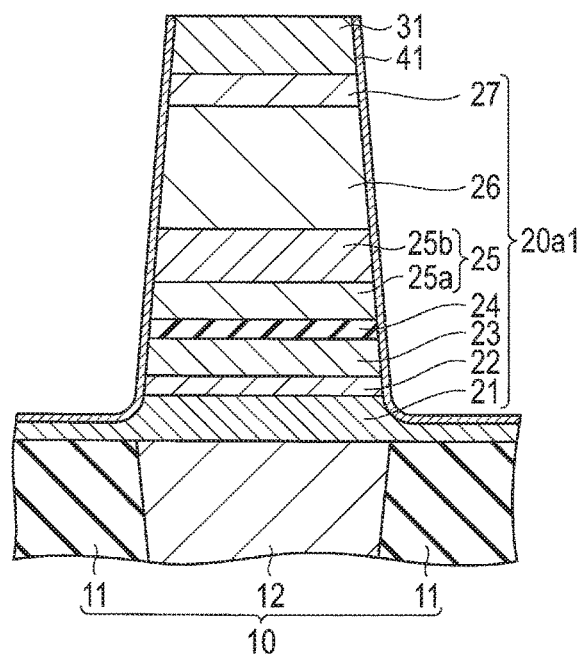
FIG. 25 is a cross-sectional view schematically showing a part of the method of manufacturing the magnetic memory device according to the fifth embodiment.

Subsequently, as shown in FIG. 25, a stacked structure 20a1 is formed by patterning the stacked film 20x. Specifically, stacked structure 20a1 is formed by etching the stacked film 20x using the hard mask 31 as a mask. IBE or RIE is used to etch the stacked film 20x. By this etching process, a re-deposition layer 41 is formed on a side surface of the stacked structure 20a1.

Subsequently, as shown in FIG. 26, oxidation treatment is applied to the side surface of the stacked structure 20a1. By this oxidation treatment, the re-deposition layer 41 is oxidized. Thus, an oxide layer 42 is formed on the side surface of the stacked structure 20a1 as a sidewall insulating layer. The oxidation treatment is similar to that of the first embodiment.

Subsequently, as shown in FIG. 27, a rare-earth oxide layer 47 containing rare-earth element and oxygen is deposited on the oxide layer 42 formed on the side surface of the stacked structure 20a1. The rare-earth oxide layer 47 may be formed by oxidizing a rare-earth element layer deposited. Thus, a sidewall insulating layer including the oxide layer 42 and the rare-earth oxide layer 47 is formed on the side surface of the stacked structure 20a1. Rare-earth element contained in the rare-earth oxide layer 47 is selected from Sc, Y, La, Ce, Pr, Nd, Pm, Sm, Eu, Gd, Tb, Dy, Ho, Er, Tm, Yb and Lu.

After forming the rare-earth oxide layer 47, thermal treatment is applied to the stacked structure 20a1. By the thermal treatment in this process, the boron (B) contained in the storage layer 23 and the lower portion 25a of the reference layer 25 is diffused to the side surface of the stacked structure 20a1, and the amorphous structure included in the storage layer 23 and the lower portion 25a of the reference layer 25 is crystallized. The boron which has reached the side surface of the stacked structure 20a1 is diffused to the oxide layer 42 and the rare-earth oxide layer 47 formed on the side surface of the stacked structure 20a1. As a result, the oxide layer 42 containing boron (B) and the rare-earth oxide layer 47 containing boron (B) are obtained, which contain boron (B) near the storage layer 23 and near the lower portion 25a of the reference layer 25.

Figure 28:
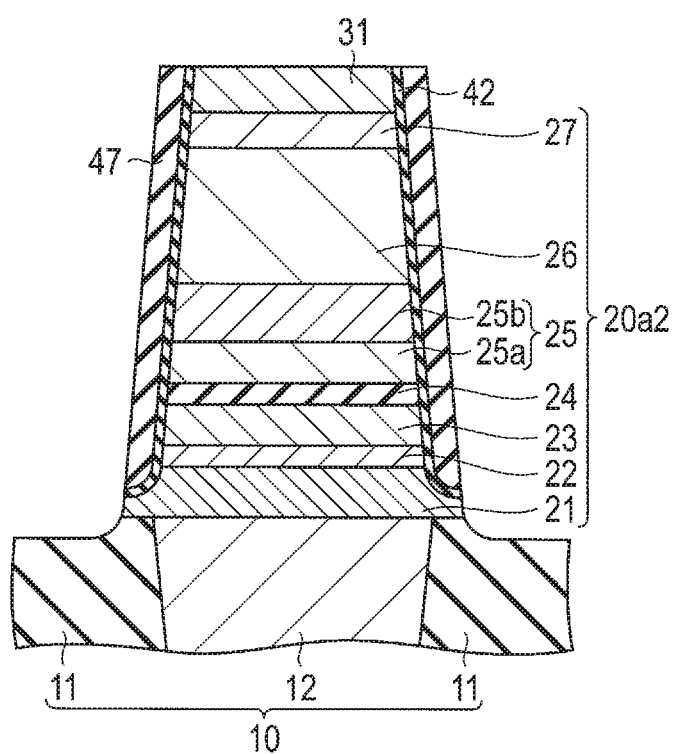
FIG. 28 is a cross-sectional view schematically showing a part of the method of manufacturing the magnetic memory device according to the fifth embodiment.

Subsequently, as shown in FIG. 28, an etching process including IBE is performed. As a result, the rare-earth oxide layer 47, the oxide layer 42, the buffer layer 21 and the interlayer insulating film 11 are etched, and thus, a stacked structure 20a2 is obtained. In this manner, the stacked structure 20a2 is completely separated from an adjacent stacked structure.

Although the subsequent processes are not shown in the drawings, for example, an insulating film which covers stacked structure 20a2, a top electrode which is connected to stacked structure 20a2, and a bit line are formed.

In the present embodiment, in a manner similar to that of the first embodiment, thermal treatment for crystallization is applied after patterning the stacked film 20x and forming the stacked structure 20a1. Thus, the boron which has been diffused in a horizontal direction is diffused to the outside of the stacked structure 20a1. Specifically, the boron which has been diffused in a horizontal direction is diffused to the sidewall insulating layer (the oxide layer 42 and the rare-earth oxide layer 47) formed on the side surface of the stacked structure 20a1, and the boron is accumulated in the sidewall insulating layer. Particularly, rare-earth oxide has excellent absorbability and permeability for boron. Thus, Boron contained in the storage layer 23 and the lower portion 25a of the reference layer 25 can be more effectively excluded. Accordingly, the amorphous structure included in the storage layer 23 and the lower portion 25a of the reference layer 25 can be more effectively crystallized, and the characteristic of the magnetoresistive element (MTJ element) can be improved.

The rare-earth oxide has low oxide formation energy relative to that of another metal oxide and silicon oxide. Accordingly, in the present embodiment, it is possible to obtain a sidewall insulating layer excellent in dielectric breakdown resistance.

It is preferable to use Gd, Tb, Y, Nd, Sm or Dy as the rare-earth element contained in the rare-earth oxide layer 47. Particularly, Gd and Tb are used normally as magnetic material. Accordingly, it is most preferable to use Gd or Tb as the rare-earth element. Y has an advantage in which the sputtering target is low in price.

The thermal treatment for the stacked structure 20a1 can be performed at a predetermined step after the rare-earth oxide layer 47 is formed. For example, the thermal treatment for the stacked structure 20a1 may be performed after formation of the insulating film covering the stacked structure 20a1, after formation of the top electrode, or after formation of the bit line.

If the re-deposition layer 41 is not formed (or is not substantially formed) on the side surface of the stacked structure 20a1 in the step of FIG. 25, oxidation process of FIG. 26 may not be performed. In this case, the rare-earth oxide layer 47 is formed directly on the side surface of the stacked structure 20a1 in the step of FIG. 27.

Figure 29:
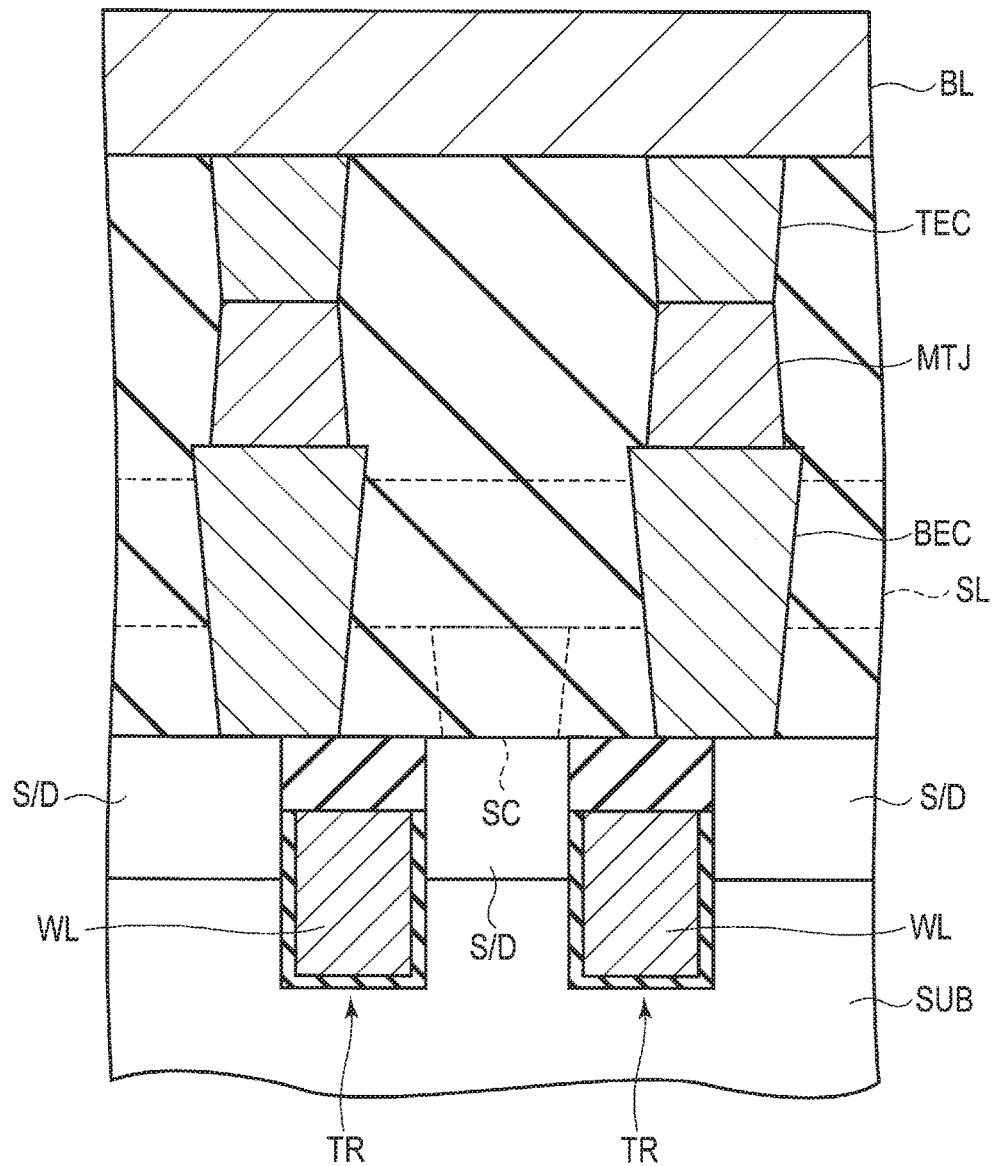
FIG. 29 schematically shows the structure of a semiconductor integrated circuit device for which the magnetoresistive elements obtained by the first to fifth embodiments are used.

FIG. 29 schematically shows the structure of a semiconductor integrated circuit device for which the magnetoresistive elements (MTJ elements) obtained by the first to fifth embodiments are used.

A buried-gate MOS transistor TR is formed within a semiconductor substrate SUB. The gate electrode of the MOS transistor TR is used as a word line WL. A bottom electrode BEC is connected to one of the source/drain areas S/D of the MOS transistor TR. A source-line contact SC is connected to the other one of the source/drain areas S/D.

A magnetoresistive element MTJ is formed on the bottom electrode BEC. A top electrode TEC is formed on the magnetoresistive element MTJ. A bit line BL is connected to the top electrode TEC. A source line SL is connected to the source-line contact SC.

It is possible to obtain an excellent semiconductor integrated circuit device by applying the structures or manufacturing methods of the magnetoresistive elements explained in the above embodiments to the semiconductor integrated circuit device shown in FIG. 24.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a stacked structure including a first magnetic layer, a second magnetic layer, and a nonmagnetic layer between the first magnetic layer and the second magnetic layer;
   a first sidewall insulating layer provided on and provided along a side surface of the stacked structure, the first sidewall insulating layer being formed of an oxide and containing boron (B); and
   a second sidewall insulating layer provided on a side surface of the first sidewall insulating layer and provided along the side surface of the stacked structure, the second sidewall insulating layer being formed of a nitride and containing boron (B),
   wherein one of the first magnetic layer and the second magnetic layer has a variable magnetization direction, and the other one of the first magnetic layer and the second magnetic layer has a fixed magnetization direction.

2. The device of claim 1, wherein the first magnetic layer and the second magnetic layer are crystallized.

3. The device of claim 1, wherein at least one of the first magnetic layer and the second magnetic layer contains at least one of cobalt (Co) and iron (Fe).

4. The device of claim 1, wherein at least one of the first magnetic layer and the second magnetic layer contains boron (B).

5. The device of claim 1, wherein the nonmagnetic layer contains magnesium (Mg) and oxygen (O).

* * * * *